United States Patent [19]
Salter et al.

[11] Patent Number: 4,980,718
[45] Date of Patent: Dec. 25, 1990

[54] REGISTRATION METHOD IN PHOTOLITHOGRAPHY AND EQUIPMENT FOR CARRYING OUT THIS METHOD

[76] Inventors: Stephen H. Salter, Broadwood, Gifford, East Lothian EH41 4JE; John T. M. Stevenson, Rackwick, Roslin Glen, Midlothian EH25 9PX; Alan M. Gundlach, 4 Upper Broomieknowe, Lasswade, Midlothian EH18 1LP, all of United Kingdom

[21] Appl. No.: 295,211

[22] PCT Filed: Jun. 24, 1987

[86] PCT No.: PCT/GB87/00444
§ 371 Date: Dec. 22, 1988
§ 102(e) Date: Dec. 22, 1988

[87] PCT Pub. No.: WO88/00362
PCT Pub. Date: Jan. 14, 1988

[30] Foreign Application Priority Data
Jun. 24, 1986 [GB] United Kingdom ............... 8615329
Mar. 19, 1987 [GB] United Kingdom ............... 8706484

[51] Int. Cl.$^5$ .............................................. G03B 27/42
[52] U.S. Cl. .................................... 355/53; 355/77
[58] Field of Search .................. 355/43, 50, 51, 53, 355/77

[56] References Cited
U.S. PATENT DOCUMENTS
4,676,649 6/1987 Phillips ........................... 355/53 X Primary Examiner—Richard A. Wintercorn
Attorney, Agent, or Firm—Michael J. Striker

[57] ABSTRACT

A method of registering one image (6) of a reticle plate (5) formed by a projection lens (21) of an optical system on a coated substrate (1) with features created previously on the substrate by an earlier image projection, comprises forming a reference pattern (7) on the substrate and monitoring the changes in position, caused by relative movement of the reticle plate (5) past the substrate (1) in a scan (or x-) direction, of the reference pattern relative to the optical system prior to forming the said one image on the coated substrate. The method is characterised in that the reference pattern (7) is interrogated by optical means (8, 9, 10, 11) operating through the projection lens (21) as the reticle plate (5) approaches a position in which an image (6) thereof will be in register with said features created previously to permit creation of said image correctly on the coated substrate without stopping the movement in the scan direction.

7 Claims, 5 Drawing Sheets

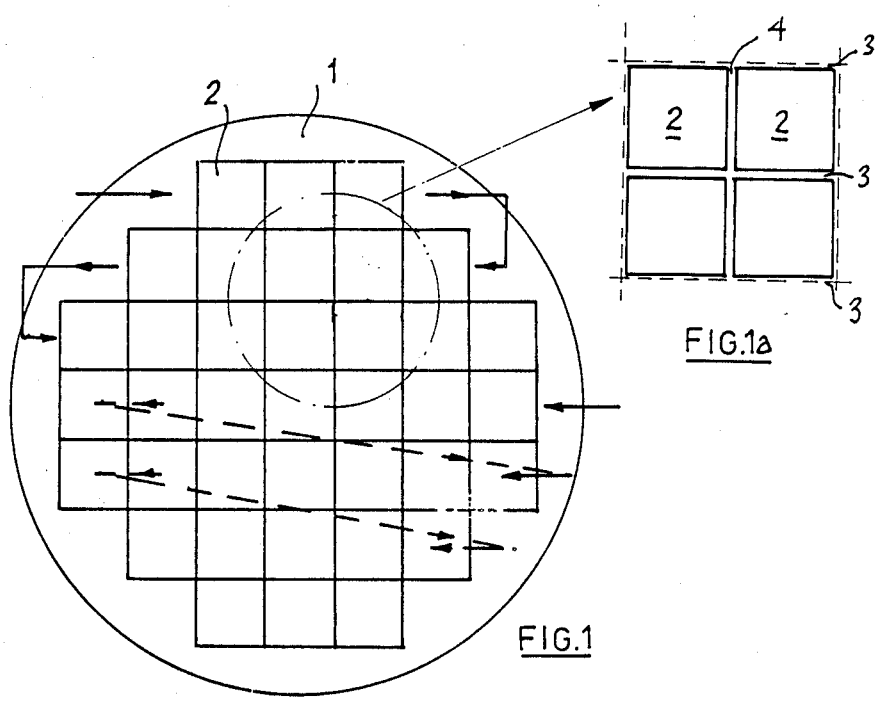
FIG.1a
FIG.1
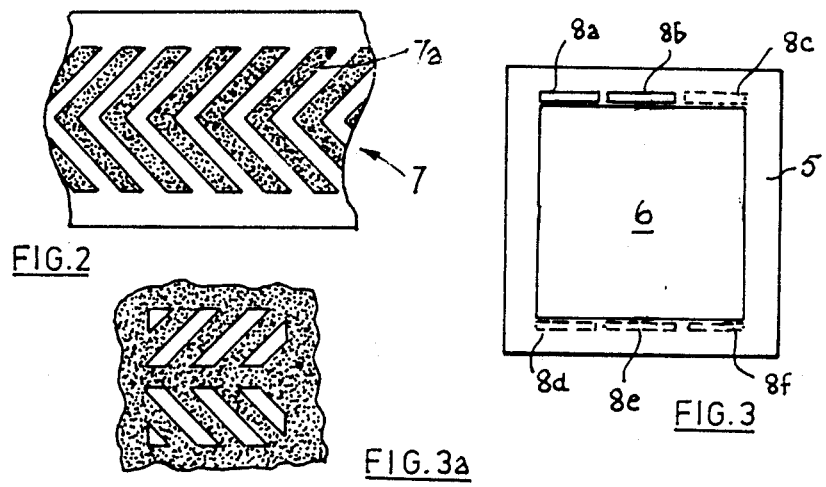
FIG.2
FIG.3a
FIG.3

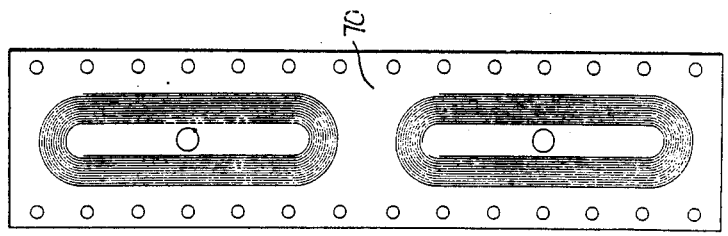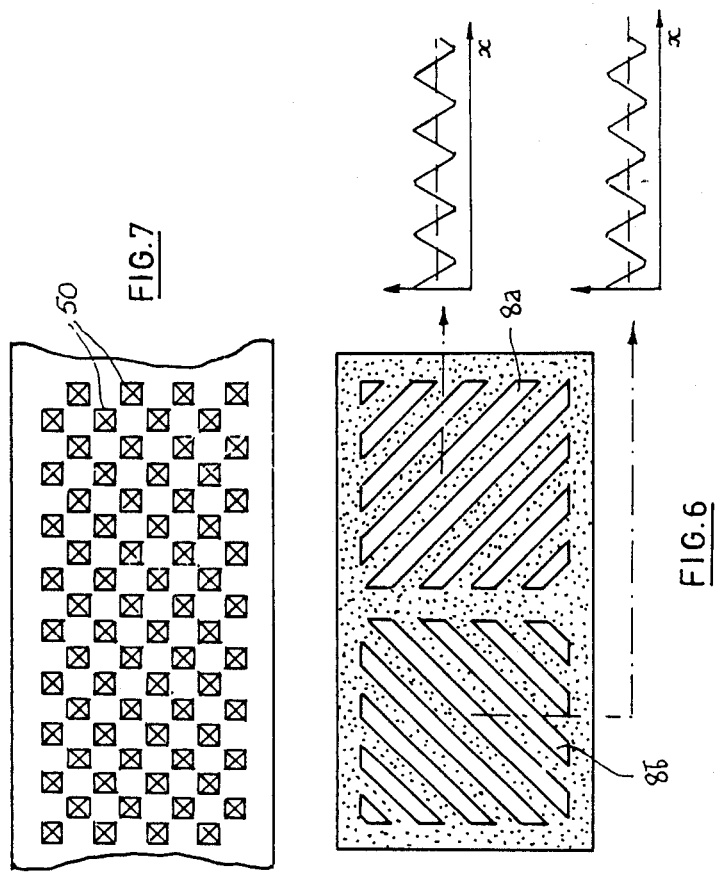

REGISTRATION METHOD IN PHOTOLITHOGRAPHY AND EQUIPMENT FOR CARRYING OUT THIS METHOD

TECHNICAL FIELD

This invention relates to the multiple exposure of optically sensitive coatings on a supporting substrate and has particular reference to the fabrication of microcircuits for semiconductor devices. In one aspect, the invention relates to an improved method of ensuring accurate registration of the multiple images required to be applied one after the other to the optically sensitive coatings applied sequentially to a substrate (e.g. a wafer of single crystal semiconductor material) to enable those coatings to be further processed (e.g. to form complex microcircuits for semiconductor chips). In another aspect, the invention relates to equipment (widely referred to as a "wafer stepper") to enable large numbers of such microcircuits to be fabricated side-by-side on a single wafer substrate.

DISCUSSION OF PRIOR ART

One of the key steps in the fabrication of microcircuits is lithography—the ability to define intricate patterns on the surface of a silicon wafer. Optical lithography, using wavelengths around 400 nm, is currently the dominant method of pattern replication and it is likely to remain so for some time.

The trend to smaller geometries for the microcircuits and the use of larger diameter wafers on which those microcircuits are to be produced has led to the use of direct step techniques using wafer steppers. These are essentially step-and-repeat cameras in which a mask pattern is imaged directly onto the coated surface of a wafer with a reduction ratio which might be 10x or 5x for example. By restricting the image field, usually to less than 20 mm square, projection lenses of high numerical aperture may be used. The wafer is stepped progressively below the camera optics and the imaging of the required pattern is repeated on an xy stage mechanism to expose the entire usable surface of the wafer with pattern registration and focus corrections being made at each exposure site.

The most common source of illumination used with state of the art wafer steppers is a mercury vapour lamp. On such wafer steppers, the intensity in the image plane is of the order of 100–1000 mW cm$^{-2}$ leading to exposure times of 500–50 mS per site when used with positive optical resists. This means that the xy stage mechanism has to move, stop, settle, adjust registration and then remain stationary during the exposure before moving to the next site.

The use of a pulsed excimer laser source has been proposed. A number of excimer lasers are available with wavelengths in the 160–350 nm range giving output pulses of about 10 ns duration at repetition rates in excess of 100 pulses per second. The energy in each pulse of such a laser source is far in excess of the dose required to expose a conventional positive resist coating and hence a "flash-on-the -fly" system, with a continuously moving stage, has been proposed. This would improve throughput by a factor of 2 or 3 and the mechanical design of the xy stage mechanism would be easier: the problems of stop-start operation such as stick-slip and dynamic yaw would be removed. Exposures are made when the scan carriage is travelling along a row of sites on the wafer and such exposures can all be made in the same direction of scan (i.e. with a flyback to the start of each new row) or with exposures made in opposite directions in each alternate row. Although the output from a wafer stepper would be reduced by unidirectional exposures, the mechanical repeatability of the xy stage mechanism would be more easily achieved.

The successful exposure of wafers requires not only good resolution of the fine geometries required for a microcircuit but also accurate registration of the new projected image with the existing wafer pattern at each exposure site. This invention relates to an improved dynamic registration method and suitable equipment for its implementation.

EXISTING REGISTRATION SYSTEMS USED WITH WAFER STEPPERS

There is no agreed standard on the type of alignment mark and mark detection technique for use in image registration on wafer steppers' there are as many systems as there are makes of wafer stepper. The marks vary from simple crosses to Fresnel zone targets and grating patterns and the detection systems range from simple photodiode and slit arrangements to video cameras with complex image processing. However, the known systems have some factors in common:

(a) the wafer is globally aligned in x, y, z and $\theta$ prior to stepping. Thus the surface of the wafer is levelled in the image plane of the optics and the overall pattern is aligned parallel to the xy axes of the stage supporting the wafer.

(b) the marks for registration are usually located in areas of the wafer where it will subsequently be divided into microcircuits (such areas are often referred to as "scribe channels").

(c) the marks are fairly small in area, usually less that 200 $\mu$ square, and are intended to be used when the stage is either stationary or moving slowly near each exposure site to update the local site coordinates.

(d) the local site corrections can be confined to small xy adjustments unless the wafer stage exhibits significant yaw error in which case local adjustment of $\theta$ may be necessary.

SUMMARY OF THE INVENTION

According to one aspect of the invention, a photolithographic method of fabricating a plurality of microcircuits on a substrate of semiconductor material by projecting an image of a reticle onto the substrate at each of a plurality of sites as relative movement occurs, in the x-direction in a cartesian co-ordinate system, between the substrate and the reticle, registration between a reference pattern on the substrate extending in the x-direction and a reference pattern on the reticle being used at least to correct for deviations in the y-direction, and to flash a light source to project the image of the reticle onto the substrate at the correct moment, is characterised in that support of the substrate in the y-direction is effected using gas bearings and the corrections for deviations in the y-direction is effected using at least one force coil.

Suitably the interrogation uses a further reference pattern formed on the reticle which is compared with the reference pattern on the substrate to give a unique indication of registration in the scan direction and information as to non-alignment in a direction normal to the scan direction upstream of registration in the scan direction.

The tolerance on layer-to-layer registration or overlay is a function of the minimum feature size, and depends on the design layout rules. A typical value for a MOS process would be ±1/3 to ±1/5 of the minimum line width. Minimum line widths of 0.5μ with overlay tolerances of ±0.15μ(3σ) are to be expected for early 1990's if the hoped-for reduction in size of circuit features is to be achieved.

When operating without stopping the movement in the scan direction (i.e. operating in a flash-on-the-fly mode) one axis of the wafer stage (say the x-axis) will be scanned in one direction whilst the y-axis will remain sensibly unchanged until the end of a row when it will step across by the appropriate distance for the next row to be scanned. The scanning in the x-direction could be effected to make the acceleration at the start of a scan and the deceleration at the end of a scan as smooth as possible, to minimise the time taken for a scan or to optimise the scan movement having regard both to freedom from "jerk" and minimum time. To correct for wafer distortion and local pattern misplacement it will usually be necessary to adjust y at each exposure site. This can be done by following a suitable pattern which gives advance information on the y co-ordinate of the next exposure site thereby allowing the necessary y-axis adjustment to be made before the flash is triggered by some pattern or feature which defines the x co-ordinate of the new exposure site. Thus for a registration process to be effective, it must operate in a dynamic continuous manner prior to exposure.

To provide a continuous y-position signal prior to exposure, a single line straddled by a pair of detectors arranged in a push-pull configuration can be used. However, such a system would be subject to all the problems of d.c. coupled analogue circuits in addition to being sensitive to debris and asymmetry of the line image.

An a.c. coupled version of the above is preferred using a periodic or grating pattern to provide an a.c. signal as the stage is scanned.

Desirably the reference pattern on the substrate is located in a scribe channel extending in the scan direction which is in the form of a twin track linear grating, the tracks having their lines at oblique angles to the direction of scan to form chevron patterns. The further reference pattern is desirably similar to the reference pattern on the substrate, since when two such chevron reference patterns are superimposed, the interference pattern seen through the projection lens is sensitive to relative displacement of the chevron patterns in both the x (scan) and y directions. If photodetectors are employed and one chevron pattern is scanned past the other in the x direction, two sinusoidal waveforms can be obtained with a frequency related to the scan velocity and the pitch of the lines on the patterns. However, the phase difference between these two waveforms is directly related to the y offset between the centre lines of the chevron patterns.

The flash to create the required image in register with the features created previously can be triggered at the correct x co-ordinate by counting the zero crossings of one of these grating signals, assuming that the trigger circuit is armed in advance by a main stage measuring system.

The oblique angles of the lines of the reference patterns are typically inclined at +45° and −45° to the scan direction but other angles (preferably in the range 20° to 70°) are not excluded. A chevron is one convenient arrangement of lines but other combinations of oblique and normal lines can be used (e.g. half a hexagon or half an octagon). Reference patterns based on oblique lines are disclosed in EP-A-111648 and EP-A-123982.

According to a further aspect of the invention, apparatus for supporting a substrate bearing an optically sensitive coating for on-the-fly exposure of the coating with an image of a reticle plate via an optical system, comprises a carriage defining a support for the substrate, means to support and means to move the carriage adjacent to two mutually perpendicular reference surfaces, one of said surfaces being used for controlling movement of the substrate support in a scan direction and the other of said surfaces being used for controlling movement of the substrate support in a direction normal to the scan direction, with means for comparing, through the optical system a first reference pattern on the substrate with a second reference pattern on the reticle plate and for deriving an error signal between desired and actual positions of the substrate support relating to at least one of the aforesaid directions, and with means to electronically adjust the actual position to reduce the derived error, and is characterised in that the means provided to reduce the error includes at least one force coil and the means to support the carriage adjacent to each reference surface includes at least one gas bearing pad

BRIEF DESCRIPTION OF THE DRAWINGS

The invention will now be further described, by way of example, with reference to the accompanying drawings, in which:

FIG. 1 is a plan of a part of the area of a wafer on which a plurality of mocrocircuits are to be formed and FIG. 1a is an enlarged view of part of FIG. 1 showing just four microcircuit sites, FIG. 2 is an enlarged view of the reference pattern formed on the wafer in the scribe channels extending in the scan direction, FIG. 3 is a plan of a reticle plate used for imaging a necessary set of features required to build up the microcircuits on the wafer of FIG. 1 and FIG. 3a is an enlarged view of the alignment pattern formed on the reticle plate for registration purposes in accordance with the method of this invention, FIG. 6 shows typical signals received from the detectors monitoring a chevron reference pattern, FIG. 7 is an enlarged plan of part of a scribe channel on the wafer of FIG. 1 showing a convenient way of creating a chevron pattern by etching, FIG. 9 shows one of the force coil plates used in the equipment of FIG. 8.

DETAILED DESCRIPTION OF THE INVENTION

Figure 4:
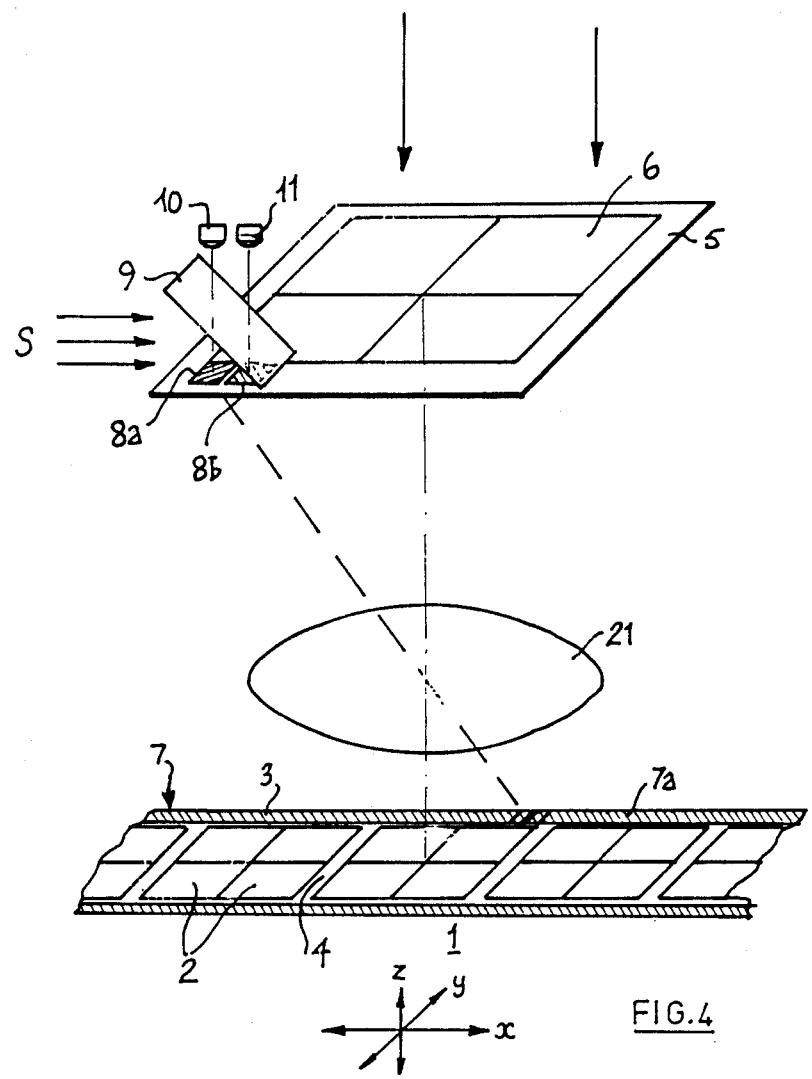
FIG. 4 is a schematic view of the relative dispositions of the recticle plate of FIG. 3 and the wafer of FIG. 1 with the equipment required to utilise the reference patterns thereon for registration on-the-fly.

FIG. 1 shows part of the surface of a wafer 1 (e.g. of single crystal silicon) which has been prepared for the production of microcircuits by photolithographic patterning of a variety of different coatings applied to the wafer. Each microcircuit will be located at a site 2, a plurality of which sites are shown in rows and columns in FIG. 1, the adjacent sites being separated by x-scribe channels 3 and y-scribe channels 4 (see FIG. 1a). In known manner, the wafer is supported on wafer scanner equipment and is moved backwards and forwards under an optical system (shown at 20 in FIG. 5) so that an image on a reticle plate 5 (see FIG. 3) can be projected down onto the sites 2 and thereby to modify the coating prior to subsequent processing. The form of the patterns projected onto the wafer 1 and the techniques employed for building up the microcircuits layer by layer is well known and since it does not form any part of this invention, will not be further described.

Figure 5:
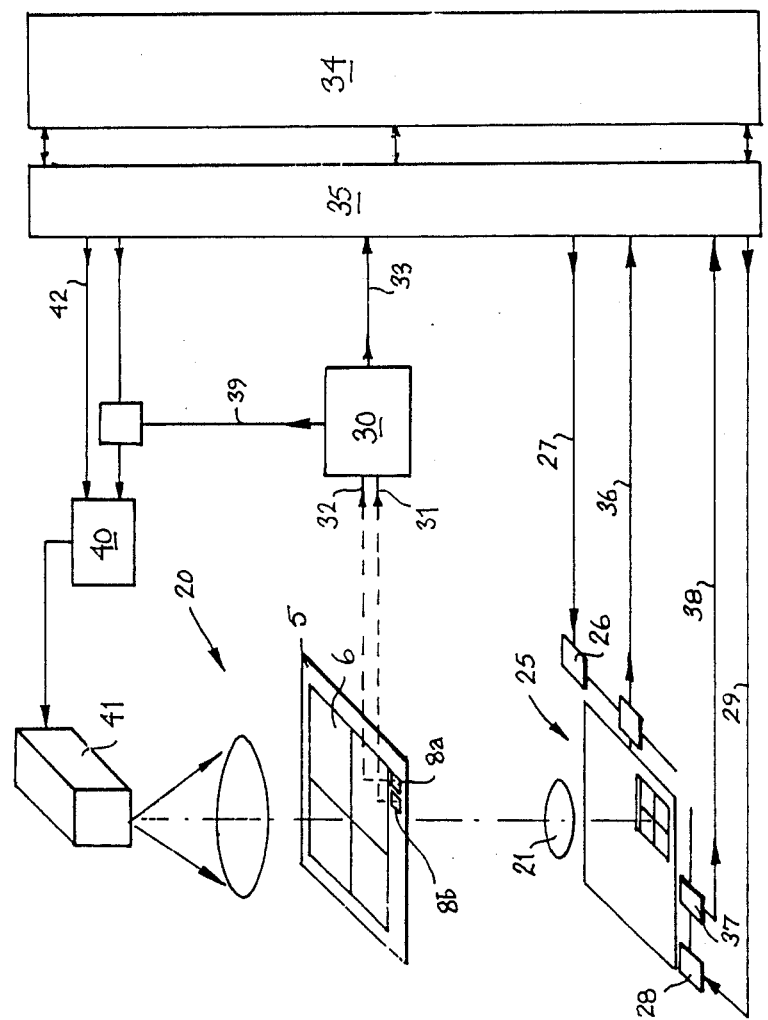
FIG. 5 is a more detailed view of the equipment shown in FIG. 4 with the electronic control equipment schematically outlined.

The reticle plate in FIGS. 4 and 5 show the image areas 6 for four adjacent sites but this is purely exemplary—any number of image areas from one upwards could be used depending on the complexity of the circuits and/or the size of the sites relative to the plate 5.

To effect the patterning of all the sites in turn, the wafer is moved progressively below the optical system and this movement can be in the serpentine stepping pattern represented by the arrows in the upper part of FIG. 1 or by a unidirectional stepping pattern as shown by the arrows and dashed lines in the lower part of FIG. 1. Extreme accuracy of positioning of the wafer 1 relative to the reticle plate 5 is required and an extremely well designed support/drive system is required if good production rates of complex highly miniaturised microcircuits are to be obtained. With either of the shown stepping patterns, controlled movement in the scan- or x-direction has to be followed by an adjustment in the y-direction, to permit stepping along the next row to be accomplished.

As will be clear from the introduction to this specification the invention is concerned with on-the-fly exposure of the sites 2 and in particular with a method of ensuring accurate registration of projected images derived from the reticle plate 5 in each of the sites 2 and with improved equipment for permitting accurate on-the-fly registration to be achieved.

It is known to use the scribe channels 3 or 4 for image registration purposes and to monitor for coincidence between a reference pattern provided in the channels 3 or 4 and some form of alignment window on the reticle plate 5. What is here proposed is to obtain precise registration signals by means of an interrogation of a reference pattern 7 on the wafer by optical means operating through a projection lens 21 (see FIGS. 4 and 5), of the optical system 20 as the image created through the reticle plate 5 is made to sweep past the sites 2, without stopping the movement in the scan direction.

The method of the invention can be described simply by assuming that a double chevron pattern such as that shown at 7a in FIG. 2 is applied to the wafer 1 during an initial processing of the wafer (e.g. at level 1). The chevron reference pattern 7a is printed along one edge of the exposure field over a length of at least several millimeters and preferably over the entire length of the exposure field The reticle plate 5 for each subsequent layer is then provided with two viewing windows 8a, 8b (see FIGS. 3, 3a, 4 and 5) containing short sections of chevron pattern. An associated illumination and detector system (e.g. a light source S, a beam splitter 9 and two photodetectors 10, 11 as shown in FIG. 4) is provided to interrogate the moving reference pattern 7a.

The position of the viewing windows 8a, 8b in relation to the image(s) on the reticle plate 5 is preferably chosen to maximise the duration of a y-align error signal prior to exposure When a unidirectional scanning pattern of the wafer 1 is to be used, the windows 8a, 8b can be situated at the corner of the reticle plate 5 much as is shown in FIG. 4. If a bi-directional serpentine scanning pattern of the wafer 1 were to be used, the windows 8a, 8b could be on the centre line of the reticle plate 5. Clearly other arrangements can be used.

By using twin track chevron patterns (those shown in FIGS. 2 and 3a have their lines at ±45° but this is not essential) the interference pattern viewed through the windows 8a, 8b will be sensitive to relative displacements both in the scan-direction and in the y-direction. Each of the photodetectors 10 and 11 will generate a periodic waveform whose frequency f is related to the scan velocity v in the x-direction and the pitch p of the lines of the patterns ($f = v/p$). The phase difference between the two periodic waveforms will be directly related to the y-offset between the centre lines of the chevron patterns For example, if the pitch of the lines on the patterns 7 and those in the windows 8a, 8b is $10\mu$ and the scan velocity is 100 mm/second the frequency of the signals obtained will be 10 KHz and a y-offset of $2.5\mu$ would cause a phase difference of 180°. Although, for simplicity the chevron patterns could have their line patterns in phase, it may be desirable to introduce a deliberate phase offset of 90° or 180° between the two tracks to simplify the processing of the a.c. signals from the photodetectors 10 and 11.

The main features of the control system are shown in FIG. 5. When operating in flash-on-the-fly mode with dynamic alignment at each exposure site for the reticle plate 5, the sequence is as follows.

The wafer stage (shown schematically at 25 in FIG. 5 but in more detail in FIG. 8) is driven under computer control to the start of a row of exposure sites. With the y-axis positioned at the nominal y co-ordinate of that row by a y-servo motor 26 controlled by a y-axis demand signal on a line 27, the x-axis is scanned along the row using an x drive motor 28 fed with an x-axis demand signal on a line 29. The y-align error signal is monitored by an alignment control circuit 30 receiving outputs 31, 32 from the photodetectors 10 and 11 (not shown in FIG. 5). Once the y-align error signal is established as a signal on line 33, control of the y-axis by this error signal is enabled via the control computer 34, its input/output interface 35 and the line 27, thereby causing the y-axis to follow the line defined by the reference pattern in the scribe channel. An initial indication of the position of the wafer stage in the y-direction is given by a signal on the line 36.

Position feedback from an x-axis sensor 37 of the wafer stage 25 is also monitored on a line 38 and, as the x-axis approaches the nominal x co-ordinate of the exposure site, control of a laser trigger 40 by the x-align error signal on line 39 is enabled, thereby firing an excimer laser source 41 causing flash exposure of the reticle pattern onto the wafer at an x-co-ordinate defined by the zero crossing of one of the alignment signals.

After a site has been exposed, the y-axis remains stationary at that y-co-ordinate until the y-align error signal is re-established in the next field and the above sequence is repeated.

In the event of failure of the align error signals, the laser source 41 may be triggered via an over-ride control on a line 42 to flash at the best estimated stage position, based on the co-ordinates of the previous site. The laser source 41 can be controlled in a similar manner when the level 1 patterns are exposed on a nominal xy grid.

There are various methods by which the laser source 41 could be triggered In a first method, a counter records the pulses resulting from passage over the "lines" of the chevron pattern appearing in scribe channel 3 in FIG. 4 as the chevron image passes the windows in the reticle plate 5 In a second method a pattern of random stripes etched in the scribe channels 4 are viewed through the projection lens 21 to fall on an enlarged negative version of a similar random stripe pattern formed on the reticle plate 5. At the moment of registration between the random stripe patterns, the light intensity viewed through the pattern of stripes on the plate 5 will drop sharply to provide the required trigger signal Desirably the y-axis must be capable of following or tracking the reference pattern as the stage scans in the x-direction in order to achieve a y-error of less than 0.05 micron at the exposure site.

The y-align error signal on line 33 will be a slowly changing function of x position and there may be discontinuities at the boundaries of the exposure fields. The maximum y-axis correction is likely to be $2\mu$ and this error will have to be removed during an x-axis travel of say 5 mm, i.e. an error gradient dx/dy of <<0.001.

The phase difference between the signals from the two arms of a chevron is a very sensitive indicator of a cross-track error. The chevron signals work in push-pull so that a lateral movement of one quarter of the effective grating pitch would produce a phase difference of 180 degrees. A phase difference of 1 degree from a grating with an effective pitch of 10 microns would therefore be equivalent to a cross-track error of only 14 nanometers. It is not difficult to make phase-sensitive detectors resolve less than 1 degree. More than two windows can be provided in the reticle plate 5. In addition to the two shown at 8a and 8b in FIG. 3, four additional windows (shown dotted at 8c. . . 8f) can be provided so that phase comparison of the signals from opposite sides of the image field can be used to indicate errors in yaw and phase comparison of the signals from the four corners of the image field can be used to indicate magnification errors.

An essential feature of the invention is that all tracking information is obtained from the wafer itself. It passes through the main projection lens and is referred to the reticle plate pattern. Changes in wafer dimensions, atmospheric effects on the optics and machine frame distortion as well as all the errors of stage movement can be corrected.

It would be possible to correct for tracking error by moving the reticle plate. However it is preferred to restrict movement of the reticle plate to the z-direction to make small changes in magnification and to make the other corrections by moving the stage which carries the wafer.

At each photolithographic stage in the process, the visibility or contrast of the reference pattern will be affected by the deposition of the successive process layers. With the arrangement shown in FIG. 4 the alignment detectors 10, 11 operate in the zero order of the diffraction pattern from the wafer and consequently they are subject to variations due to changes in reflectivity, film thickness and intra-layer interference effects.

To guarantee contrast in the zero diffracted order, alignment marks in the form of Vee grooves or pits can be used. These marks can be etched into a bare silicon wafer as a 'zeroth' reference layer and have been found to exhibit contrast >30% throughout a typical MOS process sequence.

It is not possible to anisotropically etch Vee grooves at 45° to the silicon crystal planes with conventionally oriented circuit arrays on (100) wafers in order to generate a reference pattern of the type shown in FIG. 2. However it is possible to etch an array of square pits 50 in the form of a chequer board as shown in FIG. 7. Such a chequer board pattern may be regarded as a combination or superposition of two linear gratings, where each grating consists of rows of pits at 45° to the x-axis. This type of reference pattern may be interrogated by superimposing two short sections of linear grating with the same pitch as the chequer board, one having lines at +45° to the x axis and the other having lines at −45° to the x axis, as shown in FIG. 6. The result is an interference pattern which is sensitive to relative displacement of the gratings in both x- and y-directions in exactly the same way as the patterns of FIGS. 2 and 3a. Another advantage of this etch pit arrangement is that each photodetector can now derive its signal from the full width of the reference pattern in the scribe channel.

An alternative optical arrangement would be for the photodetectors to operate in the first order of the diffraction pattern from the wafer. Although the intensity at the photodetectors would be reduced, the signals could be expected to be much less susceptible to process layer variations and, in addition, the sensitivity to alignment error should be doubled. Such an arrangement could be applied to the proposed dynamic alignment system described above.

ADVANTAGES OF THE REGISTRATION METHOD OF THIS INVENTION

The registration system proposed by this invention has all the advantages of an a.c.-coupled moire fringe measuring system, viz.

1. The signal is derived from a large number of grating lines, thereby averaging any line-to-line errors and the effect of local defects.

2. The phase relationship of zero crossings is not affected by changes in the amplitude or the shape of the waveforms. Likewise, contrast reversal of the reference pattern can be tolerated.

3. The reference pattern could be printed on any type of aligner—not necessarily the same stepper-and the flash-on-the-fly system would follow the local distortions on subsequent layers.

4. The signal processing is easy to implement in state-of-the-art hardware: at 100 mm/second, a $1\mu S$ period corresponds to $0.1\mu$ of stage movement and the signals from the registration system will be in the 10–50 KHz range depending on the choice of grating pitch and scan velocity.

The use of a twin track scale to derive an alignment error signal could be applied in other fields such as machine tools or co-ordinate measuring machines. The ability to measure deviation from a straight line as well as displacement along that line could lead to improved overall system accuracy. For example, a combined linear scale and straight-edge would be a useful alternative to a laser interferometer for calibrating machine tools. By mounting two such scales on adjacent faces of a square-section reference bar, it would be possible to measure pitch and yaw as well as straightness of the carriage motion.

Figure 8:
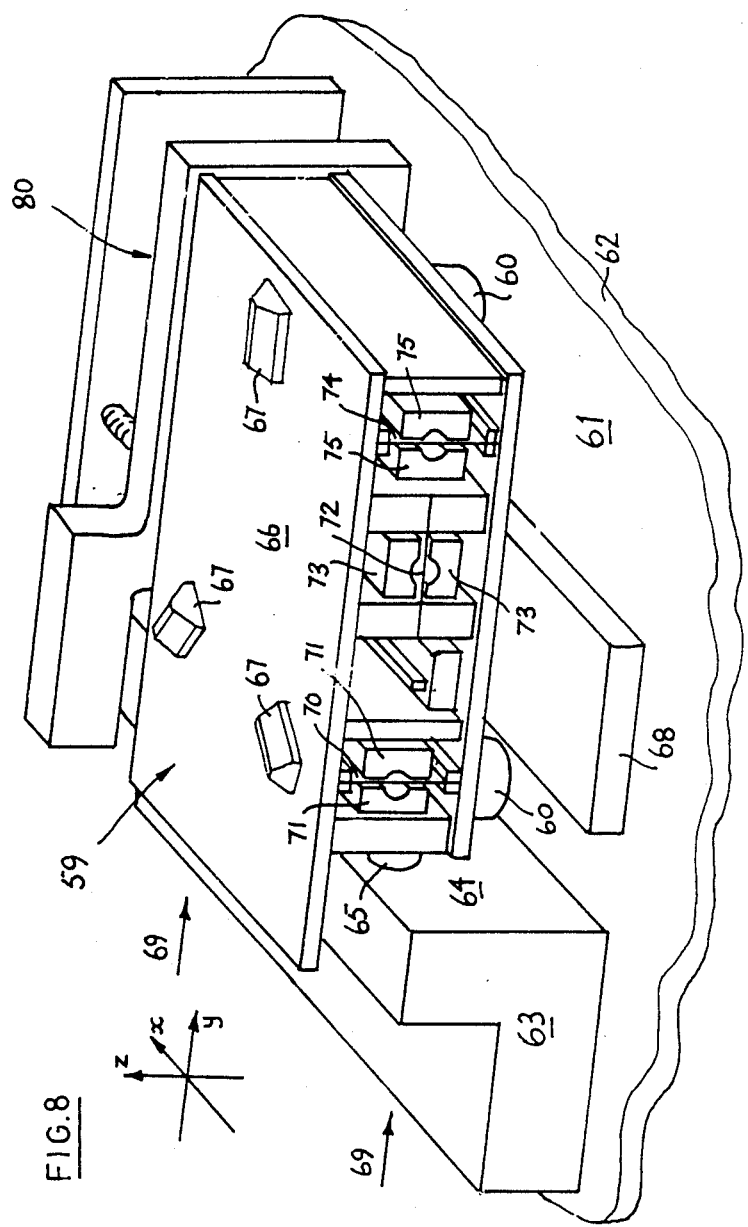
FIG. 8 shows a partial isometric view of the wafer support stage of equipment used for moving the wafer to expose the coatings thereon.

FIG. 8 shows one embodiment of wafer support equipment. An substrate carriage 59 shown is kinematically mounted on a first set of gas bearings 60 running about 5 microns above a first reference surface 61 defined by a flat table 62. The initial straightness of the scan movement is determined by a bar 63 defining a second reference surface 64. A second set of gas bearings 65 support the carriage 59 relative to the surface 64.

The substrate carriage 59 includes a support 66 on which the wafer (not shown) is mounted (e.g. via chuck mountings 67). Between the carriage 59 and the table 62 is located an electric stepping motor 68 for moving the carriage 59 in the scan (or x-) direction. This motor 68 can be a linear motor using printed circuit windings. Movement of the carriage in the y-direction at the end of each x-direction scan can be by means (shown schematically at 69) which advance the bar 63 in stages across the table 62.

The supply pressures and feed impedances of the gas bearings 60 and 65 are selected to give them rather more compliance than usual (e.g. about 0.2 micron per Newton). This will mean that a controlled force will be able to make a well-defined correction.

An adjustment range of ±2.5 micron either side of the nominal 5 microns clearance can be provided for.

A feedback measurement of pad clearance is provided by capacitance transducers built into the gas bearing pads. The pad clearance and hence the trajectory of the stage is expected to be controllable to considerably less than 0.5% of the adjustment range, i.e. to better than 25 nanometers.

By means of the reference patterns previously discussed error signals can be generated which indicate displacements in the y- and z-directions from the desired positions in these directions which have to be corrected for. These corrections are achieved using force coils 70, 72 and 74 each located between pairs of U-shaped magnets 71, 73 and 75.

The correcting forces are generated by currents in the set of force coils 70, 72, 74 (one of which is shown in FIG. 9). The coils 70, 72 and 74 are arranged so as to drive the carriage in the y- and z-directions and can also be used to correct for errors in yaw, pitch and roll. Using force coils provides a control system which has a much higher bandwidth than any pneumatic control of the gas supply to the pads 60, 65 themselves. The permanent magnets 71, 73 and 75 excite the force coils 70, 72, 74 and of course experience an opposite force. These magnets are mounted on a second or guard carriage (part of which is shown at 80) built around the wafer carrier carriage 59 and moving on gas bearings not shown) acting against the same kinematic reference surfaces 61 and 64. All connecting leads and pneumatic lines are coupled via the guard carriage 80 so that the corrupting forces and drag on the wafer carriage 59 are minimised.

The control strategy of the equipment shown in FIG. 8 can be such that one traverse is made without exposure and the pattern of errors noted in a computer memory 34. This information can be used to compute a force-correction signal which will be played back for a more accurate second pass. This gives the control system a valuable fore-knowledge of all systematic errors. A second desirable feature is that accurate placement is only necessary at the instant of flash exposure. The control system can plan trajectories which have overshoots at other times. Finally, if an unusual event occurs which makes the computer control predict that it will not be able to place the wafer within specification, then the flash can be deferred to a later traverse.

The y-direction movement of the pair of carriages 59, 80 to cover a fresh row of sites can be via a lead-screw drive (i.e. units 69) at each end of the reference bar 63 so that it slides across the surface 61 of the table 60. Such a double-ended drive allows the squareness of the bar to be adjusted by software. A gas lift can be used to eliminate stiction from this motion and a vacuum hold-down can be employed to lock the bar 63 hard onto the surface 61 when it has reached its new position.

Overlay accuracy depends directly on the accuracy of flash timing. It is therefore desirable to obtain information from the maximum available chevron area and use the observations for the maximum possible time.

The maximum area requirement can be met by using long windows of chevron patterns on the reticle plate. When magnification, yaw and sway are to be measured, six windows $8a$ to $8f$ can be used in two rows, each window being one third of the site length. An even better arrangement would be two rows of four windows each one quarter of the site length. For a 20 mm site and a 10 micron pitch between chevron lines there will then be 500 chevrons per window so that a few blemishes in each window can be tolerated.

The succession of layers of photoresist and process material laid on the substrate as the processing proceeds can be expected to alter the density, contrast and mark/space ratio of the moire fringe light signal viewed through the reticle plate. These effects can be reduced by A.C. coupling the moire fringe signal and by using the average of successive upward and downward zero-crossing times. Noise can be reduced by processing the light signal in a band-pass filter with the pass band adjusted to suit the expected moire fringe frequency.

The basis of the timing sequence can be a very high frequency crystal oscillator. The period of this oscillator should be higher than the required spatial resolution in the x-direction divided by the maximum speed of the stage in the scan direction. A 32 MHZ clock (31.3 nano second period) and a maximum stage velocity of 0.6 meters/sec implies a spatial resolution of 18.8 nanometers.

The oscillator output can be fed to a binary counter chain with synchronous rather than ripple-through outputs. For 32 MHZ and a 0.5 second table sweep it will be convenient to use a 24 bit counter (because 2 to the power $24 = 16,777,216$). The counter can be set to zero at the instant when the stage begins a new sweep in the scan direction.

If the combination of carriage 59 and the guard stage 80 provided a perfect simple harmonic oscillator with known values of mass, spring and damping, it would be possible to predict exactly the time at which it would pass through each exposure site. It would then be possible to preload a digital register with a forecast time and to trigger the flash when the register value equalled the counter value. However some imperfections must be expected. For example there will be small variations in the weight of the wafers mounted on the carriage 59. The spring rate will also be affected by temperature and ageing and the damping may not be constant. External forces may perturb the system. The theoretical forecasts will therefore not be quite accurate.

One proposal for correcting the forecast flash times is as follows. The predicting software can be used to make forecasts of the time every chevron transition will occur and these forecasts can be compared with the actual times that the transitions occur. The difference between actual time and the forecast time of each chevron transition can be used to improve the forecast of the next exposure time. The modification routine desirably takes full account of the well-known properties of damped simple harmonic oscillations.

The system can add the times of each negative-going zero-crossing to the time of the next positive-going zero-crossing time for each arm of the chevron and each window to fix the observation for a trough. Each positive crossing can then be added to the next negative crossing to obtain a peak fix. Each observation will be the average of sixteen numbers—particularly convenient for a binary arithmetic average. Even at the maximum stage velocity it is to be expected that there will be 8 microseconds available for each set of additions.

Absolute positions can be determined by the signal from the random stripe pattern falling on its own negative. The forecast times can include a correction for any observed systematic drift in the latency period of the excimer laser and its firing circuitry.

The arrangements illustrated are open to wide variation and accordingly should not be construed as limiting the scope of the invention as defined in the following claims.

I claim:

1. In a photolithographic method of fabricating a plurality of microcircuits on a substrate of semiconductor material comprising projecting an image of a reticle onto the substrate at each of a plurality of sites as relative movement occurs between the substrate and the reticle, said relative movement begin describable in terms of an x-direction, a y-direction and a z-direction of a cartesian coordinate system, in the x-direction, registering a reference pattern on the substrate extending in the x-direction and another reference pattern on the reticle, said other reference pattern being used at least to correct for deviations in the y-direction, and flashing a light source to project an image of the reticle onto the substrate in a manner timed correctly according to said registering, the improvement comprising the steps of supporting the substrate in the y-direction by gas bearings and correcting for deviations in the y-direction using at least one force coil.

2. The improvement as defined in claim 1, wherein said registering between said reference patterns is also used to correct for deviations in the z-direction, and further comprising the steps of supporting the substrate in the z-direction using others of said gas bearings and correcting for the deviations in the z-direction using at least one additional force coil.

3. The improvement as defined in claim 1, further comprising making a scan of relative movement in the x-direction between the reticle and the substrate without flashing the light source to form a plurality of y-deviations and using the pattern of the y-deviations arising during said scan to compute a force-correction signal for use in a more accurate second scan.

4. Apparatus for supporting a substrate having a first reference pattern and bearing an optically sensitive coating for on-the-fly exposure of the coating with an image of a reticle plate having a second reference pattern via an optical system, comprising a substrate carriage having a support for the substrate, means for supporting and means for moving the substrate carriage adjacent two mutually perpendicular reference surfaces, one of said surfaces being used for controlling movement of the support in a scan direction and the other of said surfaces being used for controlling movement of the support in a direction normal to the scan direction, means for comparing, through the optical system, the first reference pattern on the substrate with the second reference pattern on the reticle plate and for deriving an error signal between a desired position and an actual position of the support relating to at least one of said directions, and means for electronically adjusting the actual position to reduce the error signal, the mans provided for the electronically adjusting including at least one force coil and the means for supporting said carriage adjacent to each of said reference surfaces including at least one gas bearing pad.

5. Apparatus according to claim 4, further comprising a plurality of connecting leads and pneumatic lines and a guard carriage coupled to said substrate carriage, said guard carriage isolating the substrate carriage from external forces and drag caused by the connecting leads and pneumatic lines.

6. Apparatus according to claim 4, further comprising a guard carriage coupled to the substrate carriage, said guard carriage supporting a pair of magnets flanking each of said force coils.

7. Apparatus according to claim 6, further comprising computer means for storing information about a previous one of said scans and thus to anticipate expected values of y-deviations and z-deviations.

* * * * *